(12) United States Patent
Shimizu et al.

(10) Patent No.: US 9,508,888 B2
(45) Date of Patent: Nov. 29, 2016

(54) SOLAR CELL WITH SILICON NITRIDE LAYER AND METHOD FOR MANUFACTURING SAME

(71) Applicant: PANASONIC INTELLECTUAL PROPERTY MANAGEMENT CO., LTD., Osaka-Shi, Osaka (JP)

(72) Inventors: Sumito Shimizu, Osaka (JP); Tomohiro Saitou, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/496,243

(22) Filed: Sep. 25, 2014

(65) Prior Publication Data

US 2015/0011043 A1 Jan. 8, 2015

Related U.S. Application Data

(63) Continuation of application No. PCT/JP2013/057023, filed on Mar. 13, 2013.

(30) Foreign Application Priority Data

Mar. 30, 2012 (JP) .................................. 2012-080308

(51) Int. Cl.
*H01L 31/18* (2006.01)
*H01L 31/0376* (2006.01)
(Continued)

(52) U.S. Cl.
CPC ..... *H01L 31/1804* (2013.01); *H01L 31/02167* (2013.01); *H01L 31/03529* (2013.01); *H01L 31/03762* (2013.01); *H01L 31/035272* (2013.01); *H01L 31/068* (2013.01); *H01L 31/0682* (2013.01); *H01L 31/0747* (2013.01); *Y02E 10/547* (2013.01); *Y02P 70/521* (2015.11)

(58) Field of Classification Search
CPC ..................... H01L 31/0682; H01L 31/02167; H01L 31/022425; H01L 31/035281; H01L 31/0445; H01L 31/02021; H01L 31/0463; H01L 31/046; H01L 21/3213; H01L 21/76892
USPC ............... 438/66, 73, 97; 136/244, 258, 261
See application file for complete search history.

(56) References Cited

U.S. PATENT DOCUMENTS 5,700,467 A * 12/1997 Shima et al. ................. 136/249
6,855,627 B1 * 2/2005 Dakshina-Murthy et al. ............................ 438/624

(Continued)

FOREIGN PATENT DOCUMENTS

JP 2009-88098 A 4/2009
JP 2009-200267 A 9/2009

(Continued)

OTHER PUBLICATIONS

Masato et al., English Machine Translated of JP Publication No. 2012-033810, Feb. 16, 2012; (Machine Translated Dec. 12, 2014).*

*Primary Examiner* — Mohsen Ahmadi
(74) *Attorney, Agent, or Firm* — Cantor Colburn LLP

(57) ABSTRACT

A solar cell is provided with: a semiconductor substrate; an insulating layer formed of a silicon compound or a metal compound, and having a predetermined pattern over the substrate; and a surface covering layer formed of an amorphous semiconductor, having a same pattern as the insulating layer, and that directly contacts the insulating layer.

5 Claims, 4 Drawing Sheets

(51) Int. Cl.
*H01L 31/0352* (2006.01)
*H01L 31/0216* (2014.01)
*H01L 31/068* (2012.01)
*H01L 31/0747* (2012.01)

(56) References Cited

U.S. PATENT DOCUMENTS

| | | | |
|---|---|---|---|
| 9,257,593 B2* | 2/2016 | Hashiguchi | H01L 31/02167 |
| 2003/0008458 A1* | 1/2003 | Hashimoto et al. | 438/258 |
| 2007/0256728 A1* | 11/2007 | Cousins | H01L 31/0745 |
| | | | 136/252 |
| 2009/0009847 A1* | 1/2009 | Sasagawa | G02B 26/001 |
| | | | 359/238 |
| 2010/0258524 A1 | 10/2010 | Remiat et al. | |
| 2010/0263722 A1* | 10/2010 | Kubo | H01L 31/02167 |
| | | | 136/256 |
| 2012/0171804 A1* | 7/2012 | Moslehi | B23K 26/073 |
| | | | 438/71 |
| 2014/0151733 A1* | 6/2014 | Koike | G03F 7/0002 |
| | | | 257/98 |

FOREIGN PATENT DOCUMENTS

| | | |
|---|---|---|
| JP | 2010-532817 A | 10/2010 |
| JP | 2011-204832 A | 10/2011 |
| JP | 2012-033810 A | 2/2012 |

\* cited by examiner

SOLAR CELL WITH SILICON NITRIDE LAYER AND METHOD FOR MANUFACTURING SAME

CROSS-REFERENCE TO RELATED APPLICATIONS

The present application is a continuation under 35 U.S.C. §120 of PCT/JP2013/057023, filed Mar. 13, 2013, which is incorporated herein by reference and which claimed priority to Japanese Patent Application No. 2012-080308 filed on Mar. 30, 2012. The present application likewise claims priority under 35 U.S.C. §119 to Japanese Patent Application No. 2012-080308 filed on Mar. 30, 2012, the entire content of which is also incorporated herein by reference.

BACKGROUND

1. Technical Field

The present disclosure relates to a method of manufacturing a solar cell.

2. Related Art

In a solar cell, it is important to improve the photoelectric conversion efficiency. In consideration of such a circumstance, a back-contact type solar cell having a p-type semiconductor region and a p-side electrode, and an n-type semiconductor region and an n-side electrode formed over a back surface side of the solar cell is proposed (for example, JP 2009-200267 A). In the back-contact type solar cell, because no electrode exists on a light receiving surface side, a light receiving area for the solar light can be widened, and an amount of power generation can consequently be increased.

In a solar cell of the back-contact type as described above or the like, an insulating layer such as silicon nitride (SiN) maybe formed. However, such an insulating layer has an inferior contact characteristic with the resist, and consequently, there exists a problem in that an underlying layer of the resist is unevenly etched at an end of a resist pattern during the etching, and the precision of the patterning is thus reduced.

SUMMARY

According to one aspect of the present disclosure, there is provided a method of manufacturing a solar cell, comprising a step of, after forming a surface covering layer formed of an amorphous semiconductor directly over an entire region over an insulating layer formed of a silicon compound or a metal compound, forming a resist film directly over the surface covering layer and applying wet etching, to form the insulating layer and the surface covering layer in the same pattern.

Advantageous Effects

According to various aspects of the present disclosure, a solar cell can be provided in which the insulating layer is not unevenly etched and the precision of patterning is improved.

DETAILED DESCRIPTION

Figure 1:
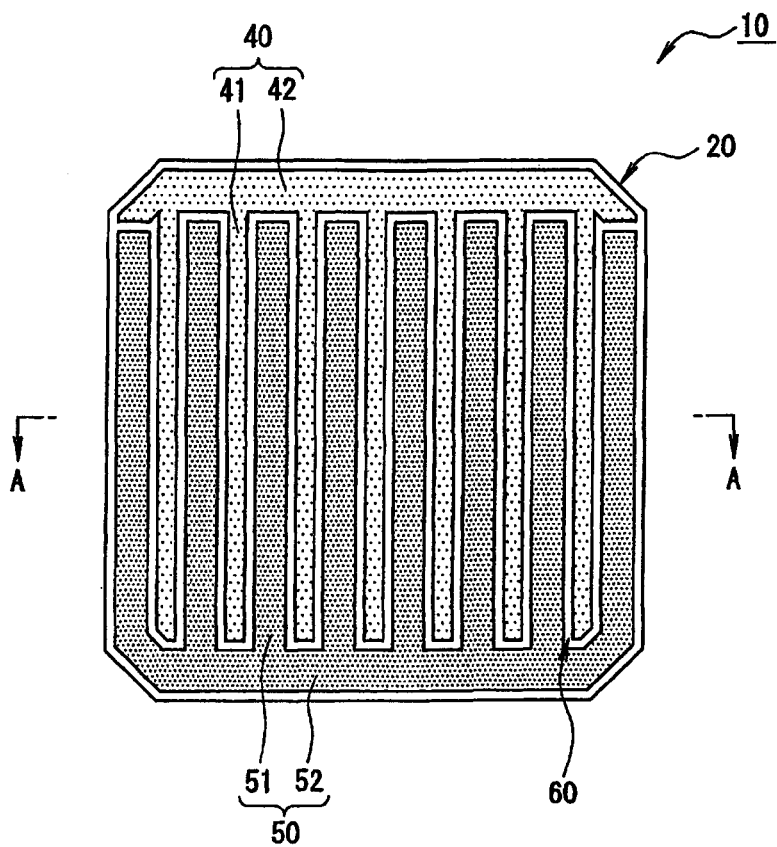
FIG. 1 is a plan view of a solar cell according to a preferred embodiment of the present disclosure, viewed from a back surface side.

A preferred embodiment of the present disclosure will now be described in detail with reference to the drawings.

The present disclosure is not limited to the below-described embodiment. Furthermore, the drawings referred to in the embodiment are schematically described, and the size, ratio or the like of the constituent elements drawn in the drawings may differ from those of the actual structures. The specific size, ratio, or the like should be determined based on the following description.

In the present specification, a description such as "a second object (such as, for example, an insulating layer) is formed over an entire region of a first object (for example, a semiconductor substrate)" is not intended to describe only a case where the first and second objects are formed in direct contact with each other, unless otherwise specified. That is, such a description includes a case where there is another object between the first and second objects. The description of "formed over an entire region" includes a case where the region can substantially be considered as the entire region (for example, a case where the object is formed over 95% of the first object).

In the present specification, a "semiconductor layer" refers to a layer having a volume resistivity of greater than or equal to $10^{-3}$ Ωcm and less than $10^8$ Ωcm, and an "insulating layer" refers to a layer having a volume resistivity of greater than or equal to $10^8$ Ωcm. In addition, an "intrinsic amorphous semiconductor layer" refers to an amorphous semiconductor layer which is substantially intrinsic (hereinafter referred to as "i-type amorphous semiconductor layer").

Figure 2:
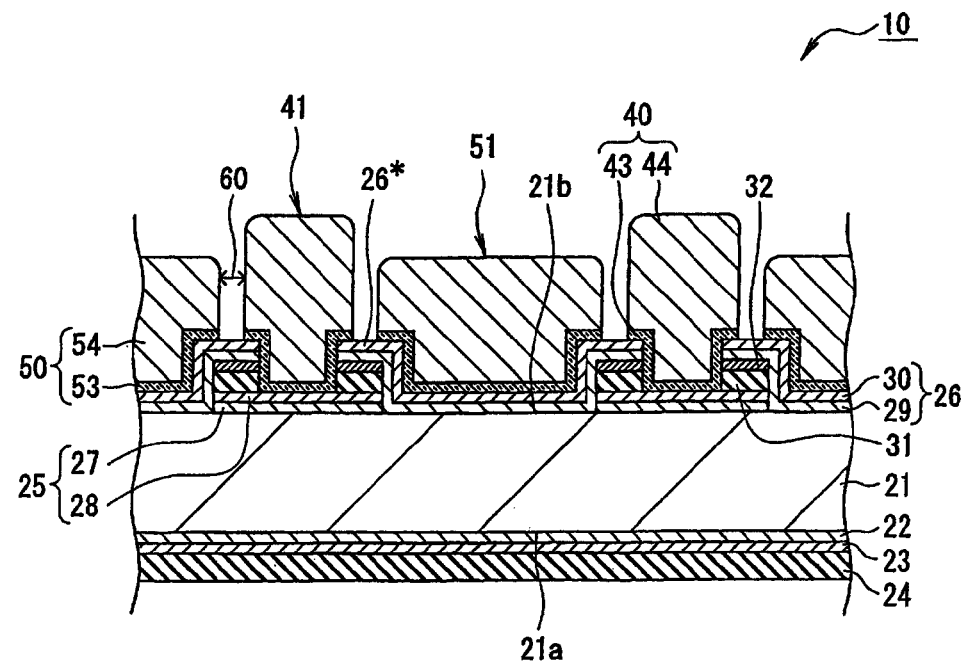
FIG. 2 is a diagram showing a part of an A-A line cross section of FIG. 1.

A structure of a solar cell 10 will now be described in detail with reference to FIGS. 1 and 2. FIG. 1 is a plan view of the solar cell 10 viewed from a back surface side. FIG. 2 is a diagram showing a part of a cross section along an A-A line of FIG. 1, and shows a cross section in which the solar cell 10 is cut in the thickness direction along a width direction of finger portions 41 and 51.

The solar cell 10 comprises a photoelectric conversion unit 20 that receives solar light and generates carriers, and an n-side electrode 40 and a p-side electrode 50 formed over a back surface side of the photoelectric conversion unit 20. In the solar cell 10, for example, the carriers generated at the photoelectric conversion unit 20 are collected respectively by the n-side electrode 40 and the p-side electrode 50. Here, a "back surface" of the photoelectric conversion unit 20 refers to a surface on a side opposite to a "light receiving surface" which is a surface in which the solar light enters from the outside of the solar cell 10. In other words, a surface over which the n-side electrode 40 and the p-side electrode 50 are formed is the back surface.

The photoelectric conversion unit 20 comprises a substrate 21 which is made of a semiconductor material such as, for example, crystalline silicon (c-Si), gallium arsenide (GaAs), indium phosphide (InP), or the like. As the substrate 21, a crystalline silicon substrate is preferable, and an n-type monocrystalline silicon substrate is particularly preferable.

Over a light receiving surface 21a of the substrate 21, an i-type amorphous semiconductor layer 22, an n-type amorphous semiconductor layer 23, and a protection layer 24 are sequentially formed. These layers are formed, for example, over the entire region other than an end edge region over the light receiving surface 21a.

The i-type amorphous semiconductor layer 22 and the n-type amorphous semiconductor layer 23 function as a passivation layer. As the i-type amorphous semiconductor layer 22, a thin film layer formed of i-type amorphous germanium or i-type amorphous silicon may be exemplified. Preferably, the i-type amorphous semiconductor layer 22 is an i-type amorphous silicon layer and has a thickness of about 0.1 nm-25 nm. As the n-type amorphous silicon layer 23, a thin film layer formed of amorphous silicon carbide, amorphous silicon germanium, or amorphous silicon doped with phosphorous (P) or the like may be exemplified. Preferably, the n-type amorphous semiconductor layer 23 is an amorphous silicon layer doped with phosphorous (P) or the like and has a thickness of about 2 nm-50 nm.

The protection layer 24 has a function to protect the passivation layer and also to prevent reflection of the solar light. The protection layer 24 is preferably formed of a material having a high light transmission characteristic. More specifically, a silicon compound layer such as silicon oxide ($SiO_2$), silicon nitride (SiN), SiON, or the like is preferable, and a SiN layer is particularly preferable. A thickness of the protection layer 24 can be suitably changed in consideration of the reflection prevention characteristic or the like, and is, for example, about 80 nm-1 µm.

Over the back surface 21b of the substrate 21, an n-type region 25 and a p-type region 26 are formed, respectively. The n-type region 25 and the p-type region 26 are preferably formed in a stripe shape extending in one direction, covering a wide area over the back surface 21b, for example, from the viewpoint of the photoelectric conversion characteristic or the like. More specifically, the n-type region 25 and the p-type region 26 are preferably placed in an alternating manner, and formed without a gap therebetween. The region between the n-type region 25 and the p-type region 26 is insulated by an insulating layer 31. In addition to the configuration exemplified in FIG. 2, alternatively, the positions of the n-type region 25 and the p-type region 26 may be reversed.

The n-type region 25 is an amorphous semiconductor layer formed directly over the back surface 21b. The n-type region 25 has a layered structure in which an i-type amorphous semiconductor layer 27 and an n-type amorphous semiconductor layer 28 are sequentially formed. Alternatively, the n-type region 25 may be formed with only the n-type amorphous semiconductor layer 28, but from the viewpoint of the passivation characteristic, it is preferable to provide the i-type amorphous semiconductor layer 27. The i-type amorphous semiconductor layer 27 and the n-type amorphous semiconductor layer 28 can be formed, for example, with a similar composition and a similar thickness to those of the i-type amorphous semiconductor layer 22 and the n-type amorphous semiconductor layer 23, respectively.

The p-type region 26 is an amorphous semiconductor layer formed directly over the back surface 21b and a surface covering layer 32 to be described later. The p-type region 26 has a layered structure in which an i-type amorphous semiconductor layer 29 and a p-type amorphous semiconductor layer 30 are sequentially formed. Similar to the n-type region 25, alternatively, the p-type region 26 may be formed with only the p-type amorphous semiconductor layer 30, but from the viewpoint of the passivation characteristic, provision of the i-type amorphous semiconductor layer 29 is preferable. The i-type amorphous semiconductor layer 29 may be formed, for example, with a similar composition and a similar thickness to those of the i-type amorphous semiconductor layer 27. As the p-type amorphous semiconductor layer 30, an amorphous silicon layer doped with boron (B) or the like is preferable. A thickness of the p-type amorphous semiconductor layer 30 is preferably about 2 nm-50 nm.

The insulating layer 31 is formed over a part of the n-type amorphous semiconductor layer 28 of the n-type region 25 in a predetermined pattern. More specifically, in a region where the n-type amorphous semiconductor layer 28 and the p-type amorphous semiconductor layer 30 are overlapped (hereinafter referred to as "overlap region 26\*"), the insulating layer 31 is formed only between the n-type amorphous semiconductor layer 28 and the p-type amorphous semiconductor layer 30. As will be described below, the insulating layer 31 is patterned by a wet etching process using a resist, but an end surface roughness of the pattern of the insulating layer 31 is small and less than or equal to an order of few microns. A thickness of the insulating layer 31 is preferably about 30 nm-500 nm.

The insulating layer 31 is formed from a silicon compound or a metal compound having a superior insulating characteristic with a volume resistivity (300 K) of greater than or equal to $10^8$ Ωcm, preferably greater than or equal to $10^{14}$ Ωcm. Preferable silicon-based insulating layers include, for example, silicon oxide (SiO or $SiO_2$), silicon nitride (SiN), SiON, or the like, and preferable metal compound-based insulating layers include, for example, alumina ($Al_2O_3$), aluminum nitride (AlN), or the like. From the viewpoint of the insulating characteristic or the like, SIN is particularly preferable. In particular, an insulating layer 31 formed of SiN has a smooth surface, is highly hydrophobic, and has a fine membrane structure. More specifically, a water contact angle thereof is about 40°-70°.

The photoelectric conversion unit 20 comprises a surface covering layer 32 formed directly over the insulating layer 31. The surface covering layer 32 is formed in the same pattern as the insulating layer 31. In other words, the surface covering layer 32 is formed covering the entire region over the insulating layer 31, and only between the insulating layer 31 and the i-type amorphous semiconductor layer 29 of the p-type region 26. The surface covering layer 32 is a thin film layer introduced to improve the precision of the pattern of the insulating layer 31, and is formed of an amorphous semiconductor. The surface covering layer 32 does not affect the characteristics such as the carrier mobility, and with the layered structure with the insulating layer 31, endurance against processes such as etching can be improved. A thickness of the surface covering layer 32 is preferably about 0.1 nm-10 nm, and particularly preferably about 1 nm-5 nm.

The surface covering layer 32 preferably has a smaller water contact angle than the insulating layer 31. In other words, the surface covering layer 32 preferably has a higher hydrophilic characteristic than the insulating layer 31. Specifically, the water contact angle of the surface covering layer 32 is about 0°-60°, and more preferably about 20°-40°. The water contact angles of the insulating layer 31 and the surface covering layer 32 can be measured by removing upper layers (such as the p-type region 26 or the like) and then dropping a water drop on an exposed surface of the layers.

As the amorphous semiconductor forming the surface covering layer 32, amorphous silicon carbide, amorphous silicon germanium, amorphous germanium, amorphous silicon, or amorphous semiconductors having these compounds as a primary component may be exemplified. In the surface covering layer 32, an n-type or p-type dopant may be introduced, but preferably, an i-type amorphous semiconductor is used. More specifically, i-type amorphous germanium or i-type amorphous silicon is preferable, and i-type amorphous silicon is particularly preferable. The surface covering layer 32 formed of the i-type amorphous silicon has a higher hydrophilic characteristic compared to, for example, the insulating layer 31 formed of SiN.

As described above, the surface covering layer 32 is formed in close contact with the insulating layer 31 and the i-type amorphous semiconductor layer 29. Boundaries between the layers may be checked, for example, by a cross sectional observation using a scanning electron microscope (SEM) or a transmission electron microscope (TEM). However, a configuration may be employed in which the boundary between the layers cannot be clearly identified. For example, in a growth process of a SiN layer by chemical vapor deposition (hereinafter referred to as "CVD"), the Si composition maybe increased at some point during the process, to form the surface covering layer 32 richer in Si than the SiN layer formed at the initial stage of the film formation process. In this case, it may not be possible to clearly identify the boundary between the insulating layer 31 and the surface covering layer 32.

The n-side electrode 40 is an electrode that collects carriers (electrons) from the n-type region 25 of the photoelectric conversion unit 20, and is provided in a pattern corresponding to the n-type region 25. The p-side electrode 50 is an electrode that collects carriers (holes) from the p-type region 26 of the photoelectric conversion unit 20, and is provided in a pattern corresponding to the p-type region 26. Between the n-side electrode 40 and the p-side electrode 50, a separation groove 60 for preventing electrical contact therebetween is formed.

The n-side electrode 40 and the p-side electrode 50 include a plurality of finger portions 41 and 51, and bus bar portions 42 and 52 connecting corresponding finger portions, respectively. The finger portions 41 and 51 have a comb shape interdigitating with each other with the separation groove 60 therebetween in a planar view. In addition, the n-side electrode 40 and the p-side electrode 50 have a layered structure in which transparent conductive layers 43 and 53 and metal layers 44 and 54 are sequentially formed, respectively. The "planar view" refers to a planar shape (x-y plane) when the structure is viewed in a direction perpendicular to the light receiving surface.

Each of the transparent conductive layers 43 and 53 is formed from a transparent conductive oxide (hereinafter referred to as "TCO") in which a metal oxide such as indium oxide ($In_2O_3$), zinc oxide (ZnO) or the like having a polycrystalline structure is doped with tin (Sn), antimony (Sb), or the like. A thickness of each of the transparent conductive layers 43 and 53 is preferably about 30 nm-500 nm.

The metal layers 44 and 54 are preferably formed from a metal having a high electrical conductivity and a high reflectance of light. More specifically, metals such as copper (Cu), silver (Ag), aluminum (Al), nickel (Ni), or the like and alloys of one or more of these metals may be exemplified. In consideration also of the material cost, of these materials Cu is particularly preferable. Thicknesses of the metal layers 44 and 54 are preferably about 50 nm-1 µm.

A method of manufacturing the solar cell 10 having the above-described structure will now be described with reference to FIGS. 3-9. Here, a configuration is described in which an amorphous silicon layer is employed as the amorphous semiconductor layer such as the i-type amorphous semiconductor layer 22, and SiN layers are employed as the protection layer 24 and the insulating layer 31.

Figure 3:
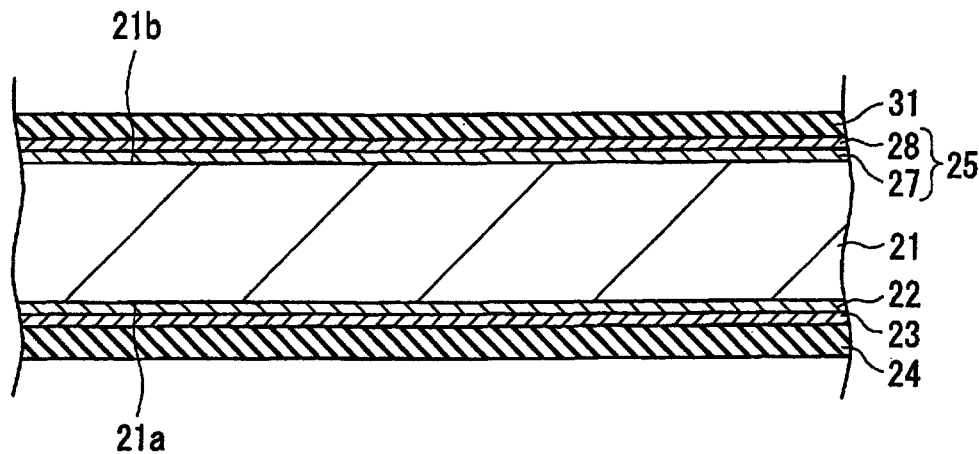
FIG. 3 is a cross sectional diagram showing a manufacturing process of a solar cell according to a preferred embodiment of the present disclosure.
Figure 7:
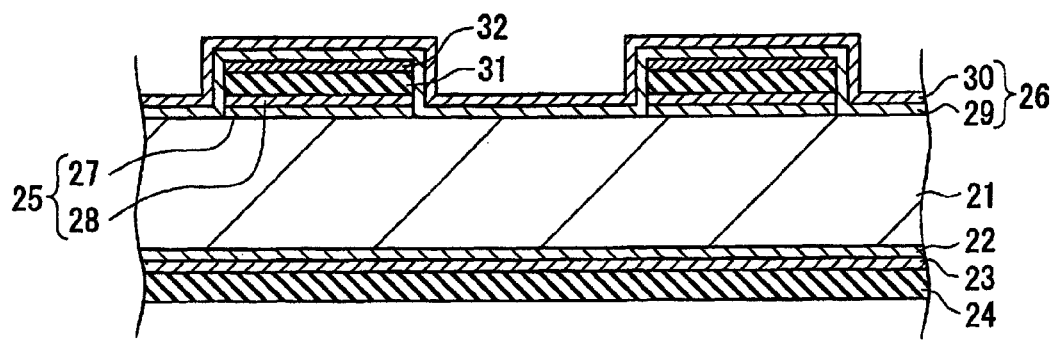
FIG. 7 is a cross sectional diagram showing a manufacturing process of a solar cell according to a preferred embodiment of the present invention.
Figure 8:
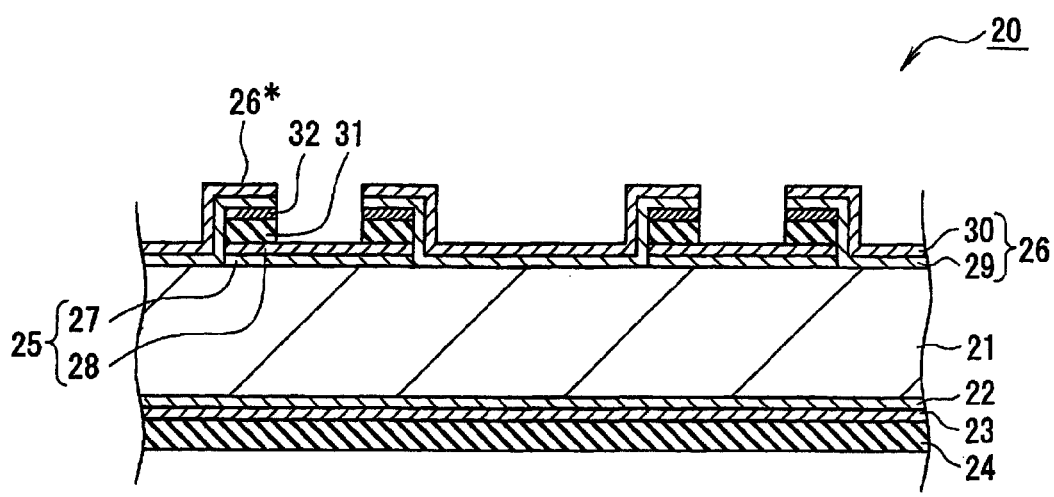
FIG. 8 is a cross sectional diagram showing a manufacturing process of a solar cell according to a preferred embodiment of the present disclosure.
Figure 9:
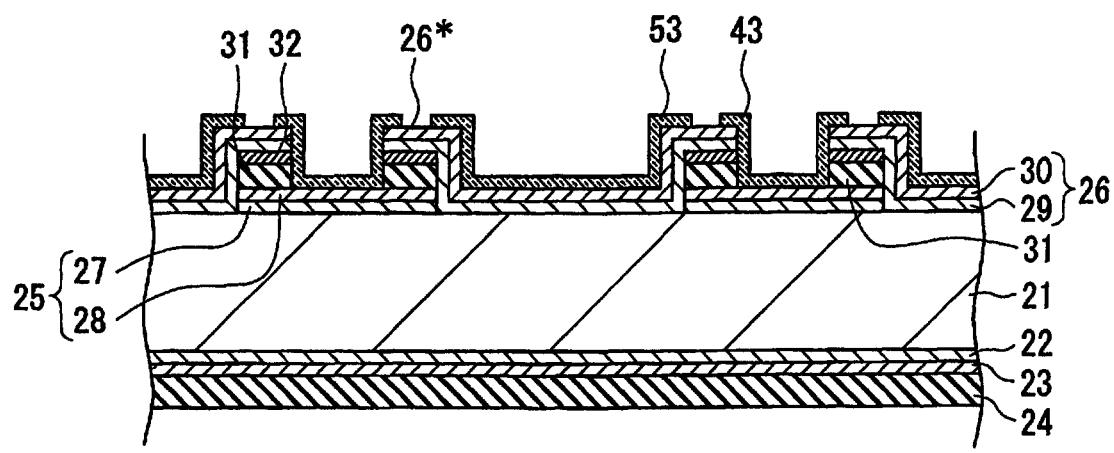
FIG. 9 is a cross sectional diagram showing a manufacturing process of a solar cell according to a preferred embodiment of the present disclosure.

FIGS. 3-8 are cross sectional diagrams showing a manufacturing process of the photoelectric conversion unit 20, and FIG. 9 is a cross sectional diagram showing an electrode forming process. First, as shown in FIG. 3, the i-type amorphous semiconductor layer 22, the n-type amorphous semiconductor layer 23, and the protection layer 24 are sequentially formed over the light receiving surface 21a of the substrate 21, and the n-type region 25 (the i-type amorphous semiconductor layer 27 and the n-type amorphous semiconductor layer 28) and the insulating layer 31 are sequentially formed over the back surface 21b. In this process, for example, a clean substrate 21 is placed in a vacuum chamber, and the layers are formed through CVD or sputtering. In addition, in this process, for example, the n-type region 25 and the insulating layer 31 are formed over the entire region other than an end edge region over the back surface 21b.

For the formation of the i-type amorphous semiconductor layers 22 and 27 through CVD, for example, material gas in which silane gas ($SiH_4$) is diluted with hydrogen ($H_2$) is used. In addition, for the formation of the n-type amorphous semiconductor layers 23 and 28, for example, material gas in which phosphine ($PH_3$) is added to silane gas ($SiH_4$) and the resulting gas is diluted with hydrogen ($H_2$) is used. By changing the hydrogen dilution ratio of the silane gas, it is possible to change the film characteristics of the i-type amorphous semiconductor layers 22 and 27 and the n-type amorphous semiconductor layers 23 and 28. In addition, by changing a mixture concentration of phosphine ($PH_3$), it is possible to change a doping concentration of the n-type amorphous semiconductor layers 23 and 28. For the formation of the protection layer 24 and the insulating layer 31 through CVD, for example, mixture gas of $SiH_4$/ammonia ($NH_3$) or $SiH_4$/nitrogen ($N_2$) is used as the material gas.

Figure 4:
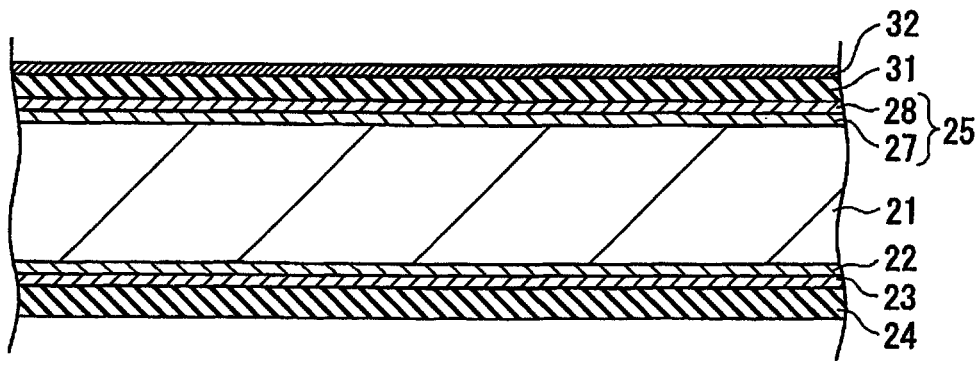
FIG. 4 is a cross sectional diagram showing a manufacturing process of a solar cell according to a preferred embodiment of the present disclosure.

Then, as shown in FIG. 4, the surface covering layer 32 is formed over the entire region over the insulating layer 31. As described above, for the surface covering layer 32, an i-type amorphous silicon layer or an amorphous semiconductor layer having the i-type amorphous silicon as a primary composition is preferable. The surface covering layer 32 may be formed, for example, through a method similar to the i-type amorphous semiconductor layers 22 and 27. Alternatively, the surface covering layer 32 may be formed by switching the material gas to only $SiH_4$ or by increasing a mixture ratio of $SiH_4$, at some point during the film formation of the insulating layer 31.

Figure 5:
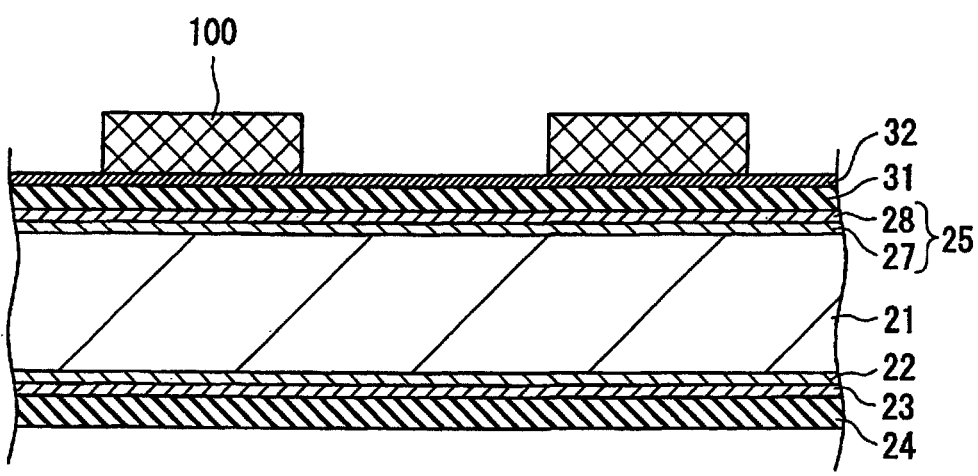
FIG. 5 is a cross sectional diagram showing a manufacturing process of a solar cell according to a preferred embodiment of the present disclosure.
Figure 6:
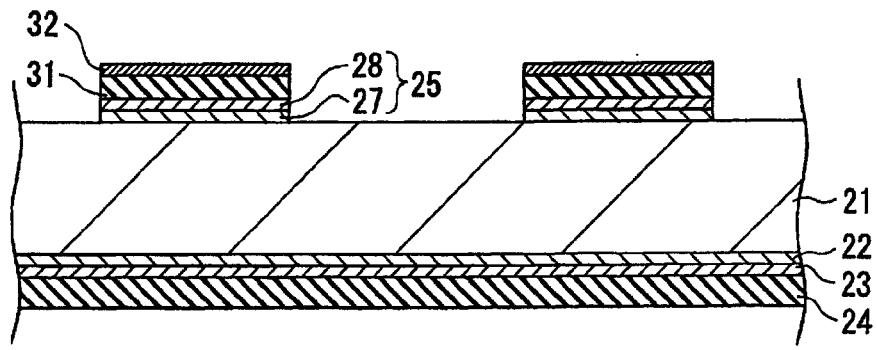
FIG. 6 is a cross sectional diagram showing a manufacturing process of a solar cell according to a preferred embodiment of the present disclosure.

Next, as shown in FIGS. 5 and 6, the layers formed over the back surface 21b are patterned. In this process, first, a resist film 100 is formed in a predetermined pattern over the surface covering layer 32. The patterned resist film 100 may be formed, for example, through an application process by screen printing or inkjet, or photolithography process or the like. Then, a region which is not covered by the resist film 100 and which is exposed is removed by wet etching. With this process, a part of the back surface 21b is exposed, and in later processes, the p-type region 26 is formed in the exposed region.

The resist film 100 used in this process is formed using a known resist composition (for example, acryl-based or phenol-based composition). General resist compositions such as acryl-based composition and phenol-based composition include a polar group such as a hydroxyl group, and is more hydrophilic than the insulating layer 31. In addition, the surface covering layer 32 has a higher hydrophilic characteristic than the insulating layer 31, and the water contact angle of the surface covering layer 32 is closer to the water contact angle of the resist film 100 (for example, about 20°-40°) than is the water contact angle of the insulating layer 31. Moreover, the surface covering layer 32 is more porous compared to the insulating layer 31 and has a lower surface smoothness. In other words, the surface covering layer 32 is more compatible with the resist film 100 compared to the insulating layer 31, and a contact area with the resist film 100 can be increased. Therefore, the resist film 100 is firmly in close contact with the surface covering layer 32.

In the wet etching process, first, the surface covering layer 32 is removed. The surface covering layer 32 can be etched, for example, using an alkaline etchant such as sodium hydroxide (NaOH) etchant (for example, NaOH etchant of 1 wt %). The insulating layer 31 can be etched, for example, using a hydrogen fluoride (HF) etchant. After the etching of the insulating layer 31 and the surface covering layer 32 is completed, the resist film 100 is removed, and the exposed n-type region 25 is etched using the patterned insulating layer 31 or the like as a mask. The n-type region 25 may be etched, for example, using the NaOH etchant, similar to the case of the surface covering layer 32. With the patterning process described above, the n-type region 25, the insulating layer 31, and the surface covering layer 32 are formed in the same pattern.

Then, as shown in FIG. 7, the p-type region 26 (the i-type amorphous semiconductor layer 29 and the p-type amorphous semiconductor layer 30) is formed over the entire region other than an end edge region over the back surface 21b. In other words, the p-type region 26 is also formed over the patterned n-type region 25 with the insulating layer 31 and the surface covering layer 32 therebetween. The p-type region 26 is formed directly over the patterned surface covering layer 32 and the back surface 21b. Similar to the n-type region 25, the p-type region 26 can be formed through CVD. However, for the formation of the p-type amorphous semiconductor layer 30 through CVD, for example, diborane ($B_2H_6$) is used as the doping gas in place of phosphine ($PH_3$).

Next, as shown in FIG. 8, apart of the p-type region formed directly over the surface covering layer 32 and a part of the insulating layer 31 and the surface covering layer 32 are removed. With this process, a part of the n-type region 25 is exposed, to allow contact between the n-type region 25 and the n-side electrode 40. In this step, first, the above-described part of the p-type region 26 is etched and removed. In this process, the above-described part of the surface covering layer 32 is removed along with the p-type region 26. The p-type region 26 is etched using the resist film as a mask and using an alkaline etchant such as the NaOH etchant. Because the p-type region 26 is normally more difficult to etch than the n-type region 25, for example, an etchant with a higher concentration (for example, NaOH etchant of 10 wt %) than the NaOH etchant for etching the n-type region 25 is employed.

After the etching of the p-type region 26 or the like is completed, for example, the resist film is removed, and the exposed insulating layer 31 is etched and removed using the HF etchant or the like and using the patterned p-type region 26 or the like as a mask. With this process, the insulating layer 31 and the surface covering layer 32 are only left in a region between the n-type amorphous semiconductor layer 28 and the overlap region 26*. In addition, the insulating layer 31 and the surface covering layer 32 are again formed in the same pattern. In other words, the surface covering layer 32 covers the entire region over the insulating layer 31, and at the same time, exists only over the insulating layer 31.

The photoelectric conversion unit 20 can be manufactured through the process as described above. The n-side electrode 40 is then formed over the n-type region 25 and the p-side electrode 50 is formed over the p-type region 26, to manufacture the solar cell 10.

The n-side electrode 40 and the p-side electrode 50 are formed, for example, through a method exemplified below.

As shown in FIG. 9, first, transparent conductive layers 43 and 53 patterned according to the shapes of the n-side electrode 40 and the p-side electrode 50 are formed. The transparent conductive layers 43 and 53 are separated from each other over the overlap region 26*, and the separation portion becomes the separation groove 60. The transparent conductive layers 43 and 53 may be formed, for example, through sputtering or CVD, and by directly forming a patterned TCO layer using a metal mask or the like, or by first forming the TCO layer over the entire region of the n-type region 25 and the p-type region 26 and then etching the TCO layer. The TCO layer can be etched, for example, using a hydrogen chloride (HCl) etchant or an oxalic acid etchant.

The metal layers 44 and 54 may be formed through electroplating. In this case, it is preferable to form a seed layer for the plating in the same pattern as and over the transparent conductive layers 43 and 53. When a Cu-plated layer is to be formed as the metal layers 44 and 54, the seed layer is also preferably a Cu layer. Through the electroplating, the metal layers 44 and 54 (Cu-plated layers) are formed over the Cu seed layer. The electroplating may be executed, for example, by applying a current of the same size through a Cu seed layer for forming the n-side electrode 40 and a Cu seed layer for forming the p-side electrode 50. A protection layer for preventing oxidation of Cu and for preventing reduction of conductivity, such as, for example, a Sn-plated layer, is formed over a surface of the Cu-plated layer, preferably.

The solar cell 10 obtained in the manner described above has a high precision for the pattern of the insulating layer 31, with a pattern end surface roughness of less than or equal to an order of a few microns. Thus, in the solar cell 10, the insulating layer 31 is patterned according to the target design pattern, and therefore, superior insulating characteristic between the n-type region 25 and the p-type region 26, for example, is achieved, and the photoelectric conversion efficiency can be further improved.

In the solar cell 10, compared to the solar cell of the related art having no surface covering layer 32, the precision of patterning of the insulating layer 31 is significantly improved. This result is due to the provision of the surface covering layer 32 having a superior contact characteristic with both the insulating layer 31 and the resist film 100, between the insulating layer 31 and the resist film 100. With such a configuration, peeling of the resist film 100 in the wet etching step can be prevented, and entrance of the etchant into the boundaries among the insulating layer 31, the surface covering layer 32, and the resist film 100 can be prevented.

Moreover, when the SiN layer is employed for the insulating layer 31 and the i-type amorphous silicon layer is employed for the surface covering layer 32, a higher patterning precision after the etching and a superior photoelectric conversion characteristic can be obtained.

The above-described preferred embodiment can be suitably modified in design within a scope that does not lose the advantage of the present disclosure.

For example, in the above-described preferred embodiment, a back-contact type structure in which the n-type region 25 and the p-type region 26 are formed only over the back surface 21*b* of the substrate 21 is exemplified, but the present disclosure can be applied to any structure in which the amorphous semiconductor is layered over an insulating layer formed of a silicon compound or a metal compound. In this case, the surface covering layer formed of the amorphous semiconductor is formed directly over the insulating layer in a same pattern as the insulating layer.

What is claimed is:

1. A method of manufacturing a solar cell, comprising:
    forming a first amorphous semiconductor layer directly on one surface of a semiconductor substrate;
    forming a silicon nitride layer directly on the first amorphous semiconductor layer;
    forming a surface covering layer comprising an amorphous silicon layer directly on an entire region of the silicon nitride layer;
    forming a resist film directly on the surface covering layer and applying wet etching, to form the first amorphous semiconductor layer, the silicon nitride layer, and the surface covering layer in a same pattern; and
    forming a second amorphous semiconductor layer directly on the patterned surface covering layer and on one surface of the semiconductor substrate;
    wherein the first amorphous semiconductor layer includes an n-type amorphous semiconductor layer provided in an n-type region; and
    wherein the second amorphous semiconductor layer includes a p-type amorphous semiconductor layer provided in a p-type region.

2. The method of manufacturing solar cell according to claim 1, wherein
    a water contact angle of the surface covering layer is closer to a water contact angle of the resist film than is a water contact angle of the silicon nitride layer.

3. The method of manufacturing solar cell according to claim 1, wherein
    the surface covering layer is an intrinsic amorphous silicon layer.

4. A method of manufacturing a solar cell, comprising:
    forming a first amorphous semiconductor layer directly on one surface of a semiconductor substrate;
    forming a silicon nitride layer directly on the first amorphous semiconductor layer;
    forming a surface covering layer comprising an amorphous silicon layer directly on an entire region directly on the silicon nitride layer;
    etching the first amorphous semiconductor layer, the silicon nitride layer and the surface covering layer, to form the first amorphous semiconductor layer, the silicon nitride layer, and the surface covering layer in a same pattern; and
    forming a second amorphous semiconductor layer directly on the patterned surface covering layer and on one surface of the semiconductor substrate;
    wherein the first amorphous semiconductor layer includes an n-type amorphous semiconductor layer provided in an n-type region; and
    wherein the second amorphous semiconductor layer includes a p-type amorphous semiconductor layer provided in a p-type region.

5. The method of manufacturing a solar cell according to claim 4, wherein
    the surface covering layer is an intrinsic amorphous silicon layer.

* * * * *